US011927814B2

(12) United States Patent
Izuhara et al.

(10) Patent No.: US 11,927,814 B2
(45) Date of Patent: Mar. 12, 2024

(54) SEMICONDUCTOR PHOTODETECTOR ARRAY SENSOR INTEGRATED WITH OPTICAL-WAVEGUIDE-BASED DEVICES

(71) Applicant: SCIDATEK INC., Austin, TX (US)

(72) Inventors: Tomoyuki Izuhara, Pleasanton, CA (US); Junichiro Fujita, Los Altos, CA (US); Louay Eldada, Austin, TX (US)

(73) Assignee: SCIDATEK INC., Austin, TX (US)

( * ) Notice: Subject to any disclaimer, the term of this patent is extended or adjusted under 35 U.S.C. 154(b) by 153 days.

(21) Appl. No.: 17/568,965

(22) Filed: Jan. 5, 2022

(65) Prior Publication Data
US 2023/0213713 A1 Jul. 6, 2023

(51) Int. Cl.
*G02B 6/42* (2006.01)
*G02B 5/20* (2006.01)
(Continued)

(52) U.S. Cl.
CPC ........... *G02B 6/4215* (2013.01); *G02B 5/201* (2013.01); *G02B 6/4204* (2013.01); *H01L 24/08* (2013.01);
(Continued)

(58) Field of Classification Search
CPC .. G02B 5/201; G02B 6/4204; G02B 6/12002; G02B 6/12004; G02B 6/4214; G02B 6/4215; G02B 2006/12123; H01L 24/08; H01L 24/80; H01L 31/02327; H01L 31/105; H01L 2224/08145; H01L 2224/80895; H01L 2224/80896
See application file for complete search history.

(56) References Cited

U.S. PATENT DOCUMENTS 6,624,444 B1 * 9/2003 Li ........................ G02B 6/43
  438/22
10,267,927 B2 * 4/2019 Nelson ................ G01T 1/20182
(Continued)

OTHER PUBLICATIONS

William Matthews, A 3.45 Gigabits/s SiPM-Based OOK VLC Receiver, IEEE PTL 2021.
(Continued)

*Primary Examiner* — Andrew Jordan
(74) *Attorney, Agent, or Firm* — Pierson IP, PLLC

(57) ABSTRACT

An optical signal to be detected enters single photon avalanche diode cells (SPAD) in a SPAD array and triggers photo event currents. Optical waveguides in the sensor carry an internal optical signal and a 1xN splitter divides the optical power into waveguide branches 206, 206', . . . 206N-1. At the coupling structure, comprising 207, 207', . . . 207N-1 positive-intrinsic-negative diode photodetector/waveguide structures, photo event currents from SPAD cells are converted to a change in the internal optical signal, by modifying internal optical signals 208, 208', . . . 208N-1. A waveguide combiner further integrates the modified internal optical signals resulting from the photo event currents from all the cells in the sub-array. After all waveguide branches' signals are combined, a photodetector detects the internal optical signal and outputs an electrical signal. The SPAD circuit may include additional capacitive coupling structures positioned between the SPAD cells and the photodetector/waveguide coupling structures.

20 Claims, 14 Drawing Sheets

(51) Int. Cl.
  *H01L 23/00* (2006.01)
  *H01L 31/0232* (2014.01)
  *H01L 31/105* (2006.01)

(52) U.S. Cl.
  CPC ........ *H01L 24/80* (2013.01); *H01L 31/02327* (2013.01); *H01L 31/105* (2013.01); *H01L 2224/08145* (2013.01); *H01L 2224/80895* (2013.01); *H01L 2224/80896* (2013.01)

(56) References Cited

U.S. PATENT DOCUMENTS

| | | | |
|---|---|---|---|
| 10,365,383 B2* | 7/2019 | Nelson | A61B 6/037 |
| 10,408,940 B2* | 9/2019 | O'Keeffe | G01S 17/89 |
| 10,420,498 B1* | 9/2019 | Horstmeyer | A61B 5/0006 |
| 10,485,293 B2 | 11/2019 | Hagimoto et al. | |
| 10,509,135 B2* | 12/2019 | Nelson | A61B 6/032 |
| 10,520,611 B2* | 12/2019 | Nelson | A61B 6/4085 |
| 10,529,003 B2* | 1/2020 | Mazed | G01N 33/551 |
| 10,564,266 B2* | 2/2020 | O'Keeffe | G01S 17/931 |
| 10,700,225 B2* | 6/2020 | Wang | H04B 10/801 |
| 10,712,455 B2* | 7/2020 | Nelson | G01T 1/20185 |
| 10,859,678 B2* | 12/2020 | O'Keeffe | G01S 7/4861 |
| 10,884,141 B2* | 1/2021 | Nelson | A61B 6/025 |
| 11,073,625 B2* | 7/2021 | Nelson | A61B 6/037 |
| 11,081,611 B2* | 8/2021 | Do Valle | H01L 31/107 |
| 11,099,282 B2* | 8/2021 | Nelson | G01T 1/20183 |
| 11,121,271 B2* | 9/2021 | Wang | H01L 31/035281 |
| 11,213,206 B2* | 1/2022 | Ruan | H04N 5/30 |
| 11,213,245 B2* | 1/2022 | Horstmeyer | A61B 5/0006 |
| 11,270,668 B1* | 3/2022 | Raynor | G06F 3/0346 |
| 11,340,338 B2* | 5/2022 | O'Keeffe | G01S 17/931 |
| 11,448,735 B2* | 9/2022 | O'Keeffe | G01S 7/4816 |
| 11,538,954 B2* | 12/2022 | Do Valle | H04N 25/77 |
| 11,747,279 B2* | 9/2023 | Mazed | G01N 21/658 385/14 |
| 11,791,432 B2* | 10/2023 | Wang | H01L 31/02327 398/115 |
| 2003/0183893 A1* | 10/2003 | Li | G02B 6/43 257/451 |
| 2005/0089993 A1* | 4/2005 | Boccazzi | C12M 1/12 435/297.5 |
| 2008/0128631 A1* | 6/2008 | Suhami | G01T 5/02 264/21 |
| 2017/0316487 A1* | 11/2017 | Mazed | G06Q 30/0241 |
| 2018/0100929 A1* | 4/2018 | O'Keeffe | G01S 17/931 |
| 2018/0136344 A1* | 5/2018 | Nelson | A61B 6/4417 |
| 2018/0143305 A1* | 5/2018 | Buskila | G01S 7/4808 |
| 2018/0172847 A1* | 6/2018 | Nelson | G01T 1/22 |
| 2018/0172848 A1* | 6/2018 | Nelson | G01T 1/20185 |
| 2018/0172849 A1* | 6/2018 | Nelson | G01T 1/20182 |
| 2019/0011541 A1* | 1/2019 | O'Keeffe | G01S 7/4817 |
| 2019/0019899 A1* | 1/2019 | Wang | H01L 31/02 |
| 2019/0025412 A1* | 1/2019 | O'Keeffe | G01S 7/4818 |
| 2019/0187302 A1* | 6/2019 | Nelson | G01T 1/20187 |
| 2019/0317227 A1* | 10/2019 | Nelson | A61B 6/032 |
| 2019/0324124 A1* | 10/2019 | O'Keeffe | G01S 7/486 |
| 2019/0388018 A1* | 12/2019 | Horstmeyer | A61B 5/318 |
| 2020/0022578 A1* | 1/2020 | Ruan | A61B 5/0042 |
| 2020/0028000 A1* | 1/2020 | Wang | H01L 31/09 |
| 2020/0033486 A1* | 1/2020 | Nelson | G01T 1/20181 |
| 2020/0072752 A1* | 3/2020 | Cipriany | G01N 21/27 |
| 2020/0142083 A1* | 5/2020 | Nelson | G01T 1/20184 |
| 2020/0271761 A1* | 8/2020 | O'Keeffe | G01S 7/4817 |
| 2020/0284883 A1* | 9/2020 | Ferreira | G01S 7/4816 |
| 2020/0373452 A1* | 11/2020 | Do Valle | H01L 31/107 |
| 2021/0109197 A1* | 4/2021 | O'Keeffe | G01S 7/4816 |
| 2021/0242354 A1* | 8/2021 | Wang | H01L 31/1804 |
| 2021/0247499 A1* | 8/2021 | Zhu | G01S 17/10 |
| 2021/0280733 A1* | 9/2021 | Do Valle | H01L 27/1446 |
| 2021/0333417 A1* | 10/2021 | Nelson | G01T 1/20181 |
| 2022/0003676 A1* | 1/2022 | Mazed | G01N 21/658 |
| 2022/0242319 A1* | 8/2022 | O'Keeffe | G01S 7/497 |
| 2022/0404475 A1* | 12/2022 | Laflaquière | G01S 7/4863 |
| 2023/0213713 A1* | 7/2023 | Izuhara | G02B 6/4214 385/14 |
| 2023/0318715 A1* | 10/2023 | Safari | H04B 10/70 398/118 |
| 2023/0333213 A1* | 10/2023 | Cadugan | G02B 27/0025 |
| 2023/0333216 A1* | 10/2023 | Cadugan | G01S 7/4868 |

OTHER PUBLICATIONS

Nicholas J.D. Martinez, Single photon detection in a waveguide-coupled Ge-on-Si lateral avalanche photodiode, OpticsExpress 2017.
Sungbong Park, Influence of carrier lifetime on performance of silicon p-i-n variable optical attenuators fabricated on submicrometer rib waveguides, OpticsExpress 2010.
Joris Van Campenhout, Design and Optimization of Electrically Injected InP-Based Microdisk Lasers Integrated on and Coupled to a SOI Waveguide Circuit, IEEE JLT 2008.
Behnam Analui, A Fully Integrated 20-Gb/s Optoelectronic Transceiver Implemented in a Standard 0.13-um CMOS SOI Technology, IEEE SSC 2006.
Andy Eu-Jin Lim, Review of Silicon Photonics Foundry Efforts, IEEE STQE 2014.

* cited by examiner

SEMICONDUCTOR PHOTODETECTOR ARRAY SENSOR INTEGRATED WITH OPTICAL-WAVEGUIDE-BASED DEVICES

FIELD OF THE INVENTION

The present embodiments generally relate to high-speed free space optical communication. In particular, they relate to the detection of high-data-rate free-space optical signals with sensors that are ultra-sensitive, have low noise, and have high-speed response. Further, the sensors have a large aperture to gather more incoming power, and they have a compact and flat form factor for integration into consumer hand-held devices such as cell phones, tablets, smart watches, and laptop computers.

BACKGROUND

SPAD was developed to detect very low optical signals. As the name suggests, SPAD is able to detect even a single photon impinging on the detector. Applications that utilize the high sensitivity of SPAD include PET (Positron Emission Tomography) scan, LiDAR (Light Detection and Ranging sensor) and QIP (Quantum Information Processing). Recently, some researchers have published potential applications of SPAD in optical communication.

For optical communication purposes, a photodetector needs to be sensitive, low noise, and high speed to carry a high data rate. Theoretically, the requirement of minimum received signal power is calculated for a certain data rate with a certain bit error rate (BER). Usually, the high-speed requirement of the photodetector limits the size of the detector structure in order to have smaller timing jitter and smaller capacitance. This size requirement limits the signal power level that the photodetector can capture directly. Often a support structure to collect a higher power level of the incoming signal is used to improve the sensitivity of the detector. It can simply be an optical lens to gather more incoming power by focusing from a large aperture of the lens to a smaller photodetector surface. However, a larger aperture lens will result in a larger optical system size in both the width and the depth directions, and the large size limits the feasibility of integrating such devices into modern electronic devices such as cell phones and tablets.

An array of photodetectors is another method to capture a large portion of an incoming optical signal. However, a larger number of photodetectors in an array with very low received signal power level for each photodetector would accumulate a large amount of thermal noise, limiting the gain in BER for the larger received signal power.

SPAD is a digital response detector meaning that the output is either 0, i.e., no or very low current, or 1, i.e., high current for detection. For this reason, SPAD does not suffer thermal noise. Therefore, SPAD is a good choice to form a large optical detection array to capture a larger signal power level for high data rate without thermal noise issues. However, so far, SPAD communication channel speed has been limited to a few Gbps (Gigabit per second) at most. One reason is the large total capacitance of the SPAD array. When the total area of the SPAD active region is large, its capacitance is large since it linearly increases with its area. For a few-millimeter-square size of SPAD array (or silicon photomultiplier, i.e., SiPM, in which a SPAD array is connected in parallel), it is common to have a capacitance of thousands of pF (picofarads). This results in the SPAD response time being as slow as tens of nsec (nanoseconds). Some types of SiPM use a capacitive coupling method to reduce the capacitance by adding additional capacitors to the SPAD circuit, but the total capacitance is still too large for a large number of SPAD cells to achieve more than a few Gbps data rate.

The present invention solves the problem by connecting SPAD (or any other type of photodetector) with integrated optical waveguides. With this structure, the capacitance of a single cell governs the total array performance and high-speed operation is possible.

SUMMARY

Embodiments are directed towards a semiconductor photodetector array sensor that includes 1) a semiconductor photodetector array with a plurality of semiconductor photodetector cells, 2) an optical waveguide structure with an optical waveguide, the optical waveguide being connected electrically to the semiconductor photodetector array, 3) a light source coupled to the optical waveguide structure, 4) an output photodetector coupled to the optical waveguide structure, and 5) a coupling structure at each of the plurality of semiconductor photodetector cells, the coupling structure being configured to connect at least one of the plurality of semiconductor photodetector cells and the optical waveguide structure to convert a photodetection event at the at least one of the plurality of semiconductor photodetector cells to an optical signal in the optical waveguide structure.

In further embodiments each semiconductor photodetector cell is a PIN (positive-intrinsic-negative) diode structure, avalanche photodiode (APD) structure, or single-photon avalanche diode (SPAD) structure.

In further embodiments the SPAD cell is fabricated to form front illuminated detection or to form back illuminated detection.

In further embodiments the SPAD includes an additional capacitive coupling structure positioned between the SPAD cell and the photodetector/waveguide coupling structure.

In further embodiments the light source and output photodetector are integrated to the optical waveguide structure.

In further embodiments the light source includes an external light source coupled to the optical waveguide structure via an optical fiber, lenses, mirrors, or gratings.

In further embodiments the light source includes hybrid integrated laser die coupled to the optical waveguide structure using a grating structure or using an edge coupling method.

In further embodiments the coupling structure comprises a PIN diode structure integrated with the optical waveguide structure and connected electrically to the output photodetector.

In further embodiments a PIN diode structure includes a coupling PIN diode that is paired with another diode which is not coupled to the optical waveguide structure and connected in anti-parallel diodes configuration.

In further embodiments the coupling structure includes a metal strip positioned across the optical waveguide structure, and the metal strip being electrically connected to the output photodetector.

In further embodiments the optical waveguide structure includes at least one optical power splitter that has multiple output waveguides before said plurality of semiconductor photodetector cells.

In further embodiments the optical power splitter includes cascaded Y splitters, a star coupler, or a multimode interference splitter.

In further embodiments the optical waveguide structure includes a first arrayed waveguide grating structure to split optical power to multiple branch waveguides before said plurality of semiconductor photodetector cells and a second arrayed waveguide grating structure to combine the branch waveguides after the plurality of semiconductor photodetector cells to combine the optical signal in the multiple branch waveguides.

In further embodiments the optical waveguide structure includes a star focusing coupler to combine optical power from a plurality of waveguides after the plurality of semiconductor photodetector cells into a designated region in a free propagation section of the coupler.

In further embodiments the semiconductor photodetector array comprises optical filters before incoming optical signals impinging the photodetector surface, said optical filters covering the photodetector array at least partially.

In further embodiments the optical filters include neutral density filter, polarization filter, or wavelength filter combined with thin film integrated filter.

In further embodiments the semiconductor photodetector array includes a plurality of sub-arrays which have the optical filters with various transmittance and separate optical waveguide structures for each sub-array with separate output photodetectors.

Further embodiments may be directed towards a method to integrate the semiconductor photodetector array and the optical waveguide structure comprises. The embodiments may include a first semiconductor wafer surface with a photodetector array integrated with CMOS processes and metal pads prepared for further bonding processing; a second semiconductor wafer with the optical waveguide structure and electrical circuitry integrated with material-specific processes and metal pads prepared to bond to the pads on the wafer with the photodetector array; wafer-to-wafer bonding process used to attach the first and the second wafer together, mating the metal pads for electrical connection; additional thinning process if the photodetector array is used in a back-side illumination configuration.

Further embodiments may be directed towards a method to integrate the semiconductor photodetector array and optical waveguide structure comprises. These embodiments may include an optical waveguide structure fabricated onto a silicon-on-insulator wafer surface; a photodetector array fabricated in the area without the optical waveguide structure; a metal layer fabricated connecting between the photodetector array and the optical waveguide structure.

Further embodiments may be directed towards a method to integrate the photodetector array and waveguide structure comprises. These embodiments may include a photodetector array fabricated on a semiconductor wafer surface; material layers built on top of the photodetector array; an optical waveguide structure fabricated in the layers above the photodetector array; electrical connections fabricated between optical waveguide structure layers and the photodetector array.

In further embodiments the coupling structure includes an additional optical reflective or refractive layer to direct incoming optical signal toward a photosensitive region of a photodetector.

In further embodiments the optical waveguide structure includes a plurality of waveguide branches connected to the plurality of semiconductor photodetector cells, where the plurality of waveguide branches are designed to have a same length before and after a photodetector sub-array coupling section.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
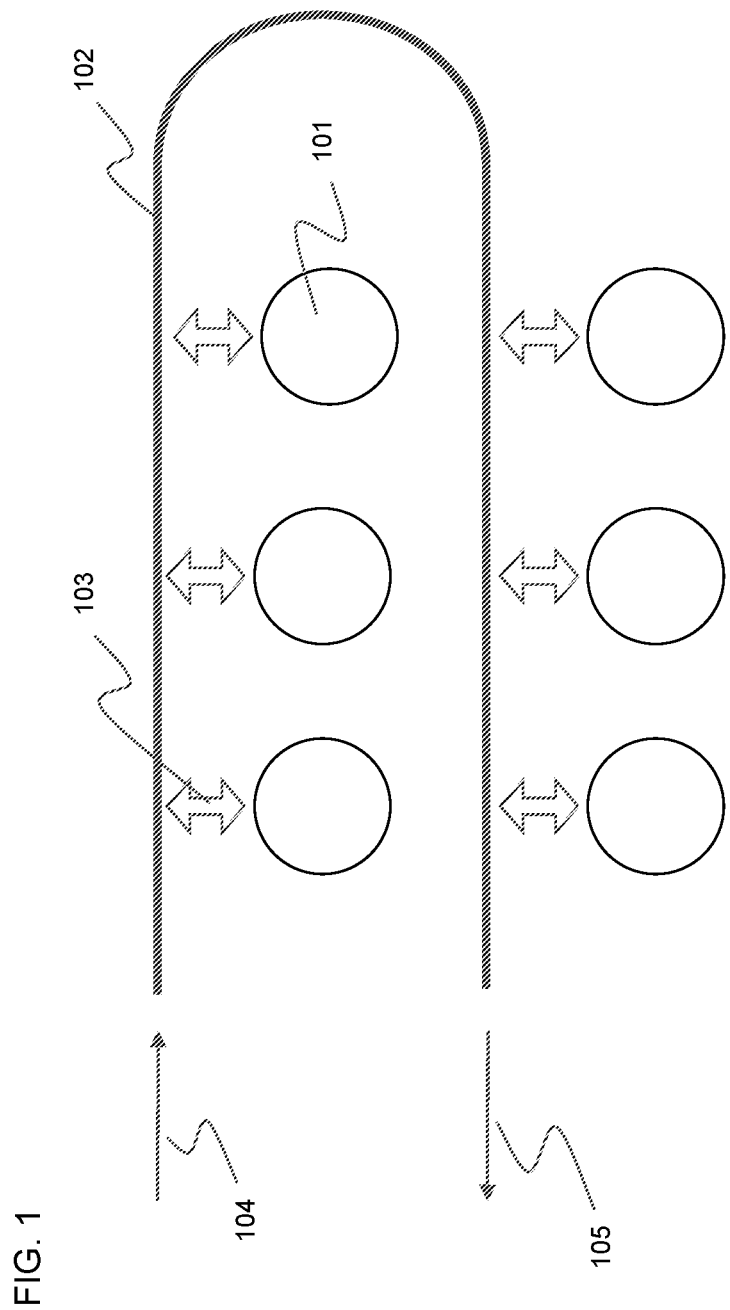
FIG. 1 depicts the concept of integrated form of semiconductor photodetector array and waveguide structure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

FIG. 1 depicts the general concept of the present invention. A semiconductor optical sensor has a SPAD array which is a group of two or more SPAD cells 101 (6 cells are shown in the figure). An optical waveguide 102 is integrated into the same chip. Each SPAD cell has a coupling structure 103 which converts the electrical signal of SPAD to the optical signal in the waveguide. An internal optical signal is received from a local light source 104 or coupled into the waveguide from a local light source 104. After accumulating the SPAD events from all SPAD cells 101 in the array, the internal optical signal is detected as a sensor electrical signal at a photodetector 105. By using the internal optical signal to accumulate the SPAD array signal before the internal optical signal is detected as a sensor electrical signal at photodetector 105, high sensitivity, large aperture/sensor size, and high speed are optimized simultaneously. The present invention constructs SPAD and waveguide in discrete structures, not in a single structure, so that both SPAD and waveguide-based devices can be optimized independently to achieve higher performance levels.

Figure 2:
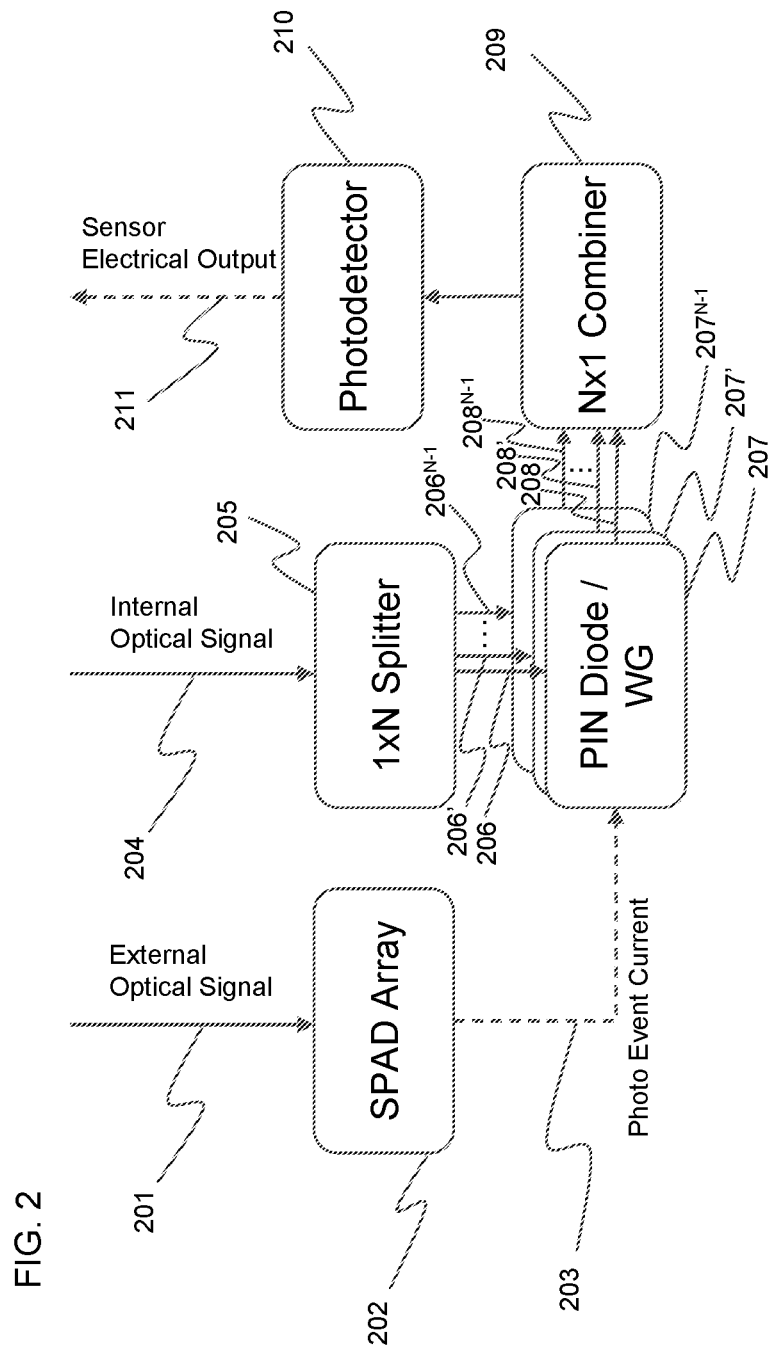
FIG. 2 depicts the flow of optical and electrical signals in the sensor.

Signal flow in the sensor of the present invention is described schematically in FIG. 2. Optical signals are shown as solid arrows and electrical signals are shown as dashed arrows. The optical signal to be detected 201 enters SPAD cells in a SPAD array 202 and triggers a photo event current 203. Optical waveguides in the sensor carry internal optical signal 204 and a 1xN splitter 205 divides the optical power into waveguide branches 206, 206', ... $206^{N-1}$. At the coupling structure 207, 207', ... $207^{N-1}$ (PIN diode/WG), a photo event current 203 from a SPAD cell is converted to a change in the internal optical signal, resulting in modified internal optical signal 208, 208', ... $208^{N-1}$. The waveguide combiner 209 further integrates the modified internal optical signals resulting from the photo event currents from all the cells in the sub-array. After all waveguide branches' power are combined, a photodetector 210 detects the internal optical signal and outputs an electrical signal 211. This is effectively an OEOE (Optical-Electrical-Optical-Electrical) system. FIG. 2 shows an example of the implementation of the present invention. Each component of the sensor will be described in detail in the following paragraphs.

A single photon avalanche diode (SPAD) is an avalanche photodiode (APD) used with a bias voltage over the breakdown voltage. An APD is a semiconductor optical detector fabricated using a CMOS process on silicon or III-V compound semiconductor depending on the target wavelength to detect. When an APD is biased over the breakdown voltage (SPAD operation), an electron-hole pair created by an incoming photon generates an avalanche current in the diode which can be detected as a SPAD event. Since the bias is above the breakdown voltage, even a single photon can trigger the avalanche and can be detected clearly. The avalanche current output makes this sensor a digital sensor, the output is either 0, i.e., there is no avalanche, or 1, i.e., there is an avalanche. Due to its ultra-sensitive nature, SPAD is used in applications such as PET scan, LiDAR and QIP.

Figure 3:
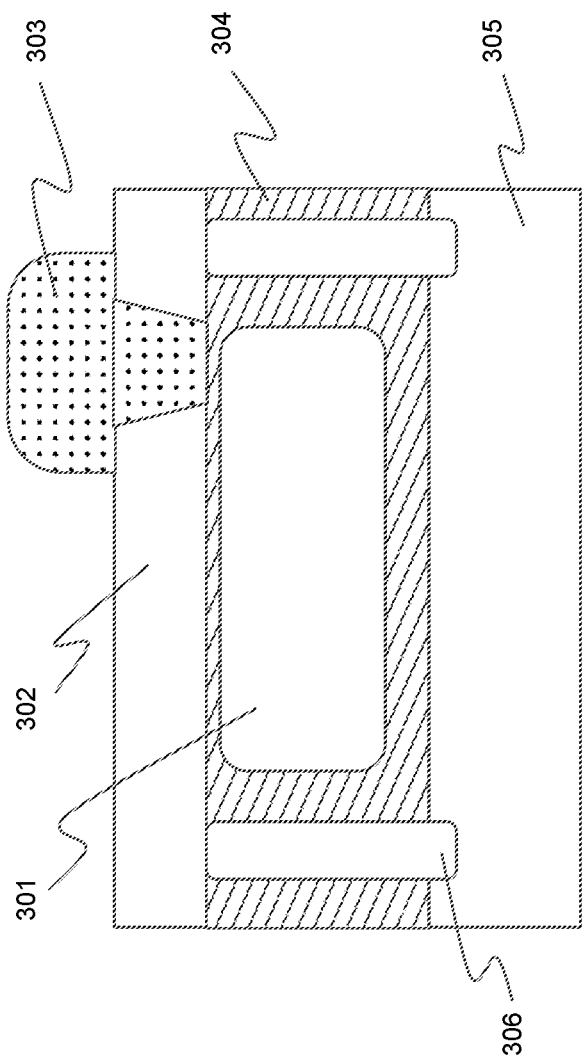
FIG. 3 depicts a typical cross-sectional view of a SPAD structure.

FIG. 3 shows a typical SPAD design (cross section view). SPAD is fabricated by standard CMOS processes on a substrate wafer 305. Epitaxial layers 302, 304 and metallization 303 form an APD structure. Often, isolation structures 306 are used to minimize crosstalk. A photon is detected when it enters the photosensitive region (High field region) 301 and generates an electron-hole pair. Depending on the application, SPAD is used in a front-illumination or a back-illumination configuration. Usually, a back-illumination configuration has a higher fill factor (a larger fraction of the surface is used for detection) since there is nothing to block the incoming optical signal below the SPAD. Metallization and circuitry are placed above the photo sensitive region.

Figure 4:
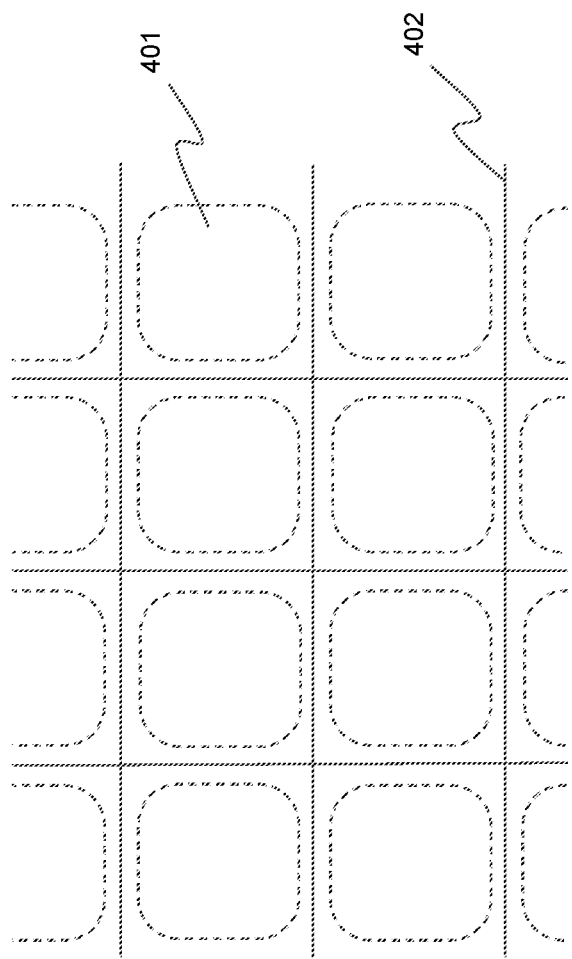
FIG. 4 depicts an array of photodetector cells.

SPAD is often used in an array configuration. FIG. 4 depicts a top view of a grid patterned SPAD array showing a photosensitive region 401 and cell boundary 402. One of the reasons to use an array format is to increase the aperture size of the detector. The array has a much larger detection area compared to a single cell device. With more power captured with the larger aperture, the SPAD array can be more sensitive to the low power level of incoming signals. Another reason to make it in an array configuration is to solve the saturation issue of SPAD. When SPAD detects photons, it creates an avalanche current in the diode structure. Before detecting another photon, the SPAD cell needs to be quenched back to the high-bias no-avalanche current state. During the detection and quenching process, the SPAD cell is not responsive to any incoming signal. This period is called a "dead time" of SPAD. Because of the dead time, SPAD can only count photons up to a certain frequency. If the system has only a single SPAD cell, this saturation occurs at relatively low input optical power. To overcome this limitation, the system could have many SPAD cells. The array allows the system to have most of the time some SPAD cells ready to detect a photon so that the array sensor will not be saturated easily.

Silicon photomultiplier (SiPM) is a SPAD array in which cells are connected in parallel. The output of a SiPM chip is often the total current at the bias pin. A SPAD event will be detected as a spike of the bias current. If multiple SPAD cells detect signals, the output shows the accumulated bias current for all the active SPAD cells. Some SiPM modules have a "fast" output pin which is capacitively coupled to the bias pin in order to have faster response time compared to the bias pin itself.

SPAD arrays, especially in the form of SiPM, are often used for applications such as PET scan. Additionally, research publications reported potential use of SPAD arrays for optical communication purposes. For example, Matthews (2021) reported FSO (free space optical) wireless communication with 3.45 Gbps data rate using off-the-shelf SiPM products. Although the data rate of 3.45 Gbps is not slow, it is much lower than the potential of FSO wireless communication data rate. The issues of the currently available SPAD arrays (including SiPM) when used for communication are the dead time and the capacitance. The dead time causes saturation of the photon counting efficiency, then leads to low photon count rate, which is equivalent to cut off frequency. The capacitance causes slow response time of the sensor from the RC (resistance×capacitance) time constant. Both issues slow down the sensor's response time. The dead-time issue can be overcome by making the array size larger, i.e., more SPAD cells in the sensor. A large number of SPAD cells means that more cells are available even when many cells are in the dead time period and cannot react to incoming signals. However, in conventional SPAD arrays, the large number of SPAD cells increases the total capacitance of the sensor. This invention solves the issue of large capacitance of SPAD arrays and makes it possible to have even larger SPAD arrays for communication purposes.

Figure 5:
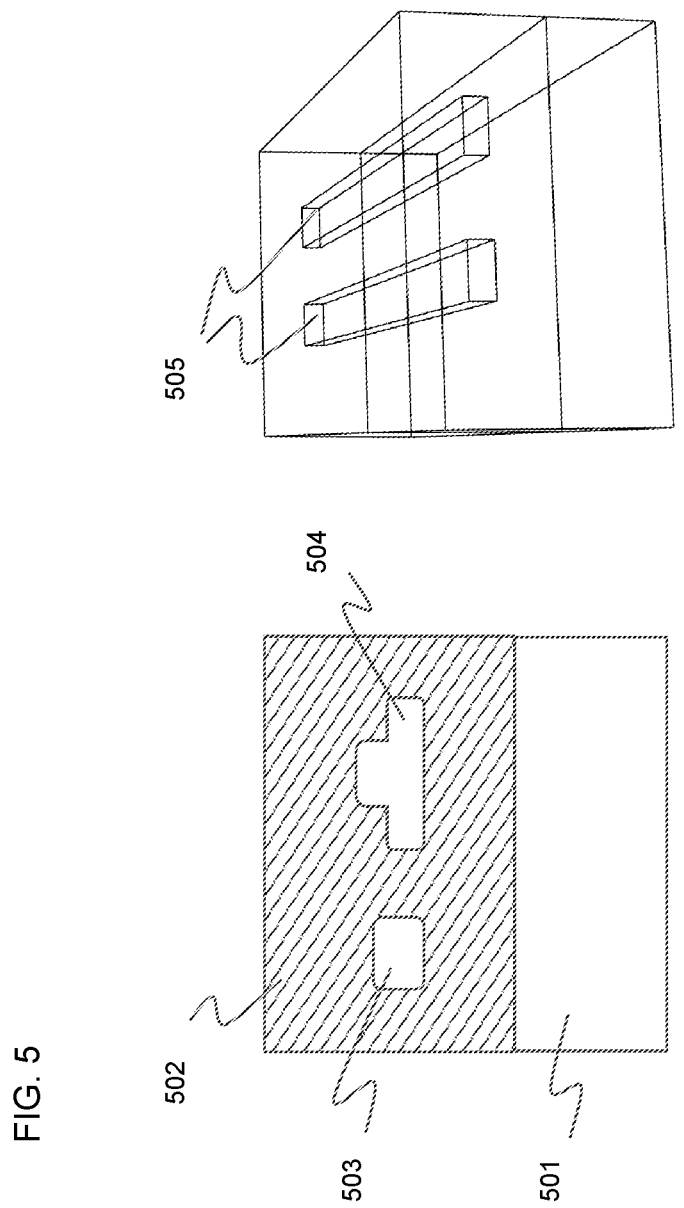
FIG. 5 depicts a typical integrated optical waveguide structure. A cross sectional view on the left and a perspective view on the right.

A waveguide is a structure which can contain electromagnetic power and guide it through in the structure. There are many types of waveguides for different wavelengths and applications. Photonic integrated waveguide is a particular type of waveguide fabricated on semiconductor or oxide wafer surfaces. They typically have a line form to guide optical power along the long dimension, acting as a microscale optical 'pipe'. An example of silicon waveguide built in a SOI (silicon on insulator) wafer is shown in FIG. 5. FIG. 5 includes a cross sectional view on the left and a perspective view on the right. On a base silicon wafer 501, an oxide layer 502 with low refractive index is built as a cladding layer. Waveguide cores 503, 504 with higher refractive index are surrounded by the cladding layer. Various shapes are known for waveguide core, here a channel waveguide 503 and a ridge waveguide 504 are shown. 505 shows two channel waveguides in a line shape running parallel. If designed properly, these waveguides can have very low propagation loss (loss of power passing in the structure). Many devices in the optical fiber communication industry use photonic integrated waveguides as a key element. Some notable examples of photonic integrated waveguide are high speed optical modulators and arrayed waveguide gratings that route signals according to their wavelength.

Embodiments use waveguide structures and optical signals in the waveguides to accumulate the SPAD events in a large SPAD array. FIG. 1 depicts the general concept of the present embodiments. For example, a waveguide with a line shape (or a microscale optical 'pipe') is placed along the SPAD array cells. Each SPAD cell can couple to the waveguide electrically, at different locations along the waveguide, and an optical signal in the waveguide can detect the SPAD activity, then along the waveguide, SPAD activities from multiple cells are recorded to the optical signal in the waveguide. Since both the SPAD cells and the waveguides can be fabricated on semiconductor wafers, they can be integrated in a single semiconductor chip form. The waveguide structure requires light sources, for example a laser diode, to input an optical power for the "internal" optical signal. This internal optical signal carries accumulated SPAD events information in optical signal form in the waveguide structure. The light source can be either integrated onto the waveguide structure, hybrid integrated onto the same surface of the waveguide, or externally coupled to the waveguide structure. The wavelength of the internal optical signal for the waveguide structure must be different from the external optical signal wavelength that the SPAD cells receive so that there is no crosstalk between the external optical signal to the SPAD array and the internal optical signal in the waveguide structure, especially crosstalk of internal photons detected by SPAD cells. For this reason, it is preferable that the wavelength of the waveguide structure be longer than the signal wavelength received by the SPAD cells. For example, 905 nm signal wavelength is detectable at silicon SPAD cells, and 1550 nm wavelength of the waveguide signal cannot be detected at the silicon SPAD since the detection limit of silicon SPAD is around 1000 nm. The waveguide structure has photodetectors to convert the internal optical signal to electrical signal as an output. The photodetectors can either be integrated into the waveguide structure, hybrid integrated to the same surface of the waveguide, or externally assembled and coupled.

This invention has SPAD cells and waveguide structures as separate structures. Separate structures allow independent optimization of their functionality. SPAD cells can be designed to have the highest fill factor, i.e., highest sensitivity, when the SPAD structure is decoupled from the waveguide structure. There are previous reports integrating SPADs into waveguide structures, for example Martinez (2017). Such a structure is not suitable for the signal coming from free space, as in free-space optical communication, range detection, and 3D imaging, because the detection region of the SPAD cell is very small and the fill factor will be very small too. To avoid the issue, in the present invention, SPAD cells have a conventional structure which could have nearly 100% fill factor, and a separate waveguide structure is routed between the SPAD cells to accumulate the SPAD events. SPAD events are avalanche currents of the biased APD. To sense the SPAD event by the internal optical signal of the waveguide, a coupling mechanism is required between the SPAD and waveguide structure.

The coupling between SPAD cells and a waveguide can be done using various methods. A preferable method should be sensitive and should have high bandwidth coupling. One example of such a mechanism is additional optical loss in the waveguide introduced by passing an electrical current through the semiconductor waveguide. This type of coupling has been reported in the prior art. For example, Park (2010) reported passing an electrical current through PIN (or p-i-n) diodes in silicon induced additional propagation loss in the waveguide built into the intrinsic silicon section of the PIN diode. The additional loss amount is related to the amount of current passing through the PIN diode. The range of loss attainable with their particular material choice is, for example, 10 dB/mm with current density of 20 mA/mm. They also reported that the 3-dB cutoff frequency of such coupling is 200 MHz for their design. Although this is sufficient to achieve more than 10 Gbps, Park reported that the fabrication process can be optimized to introduce a specific amount of defects in the intrinsic region to further shorten the carrier lifetime and to achieve higher cutoff frequency.

Figure 6:
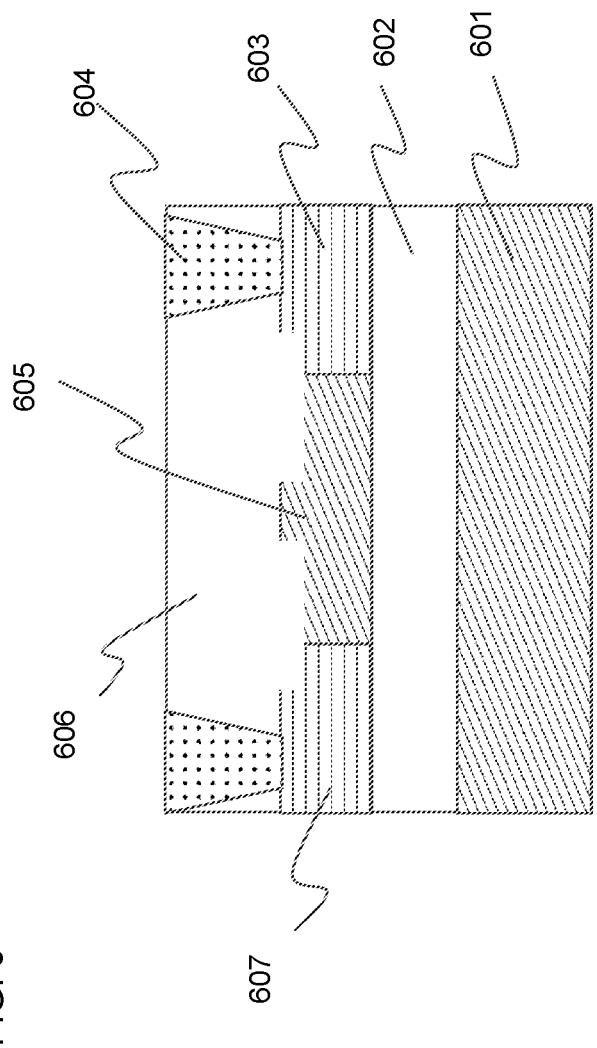
FIG. 6 depicts a cross sectional view of a coupling structure between SPAD and waveguide, i.e., a PIN diode with an optical waveguide integrated.

Following Park's report, one example structure of PIN diode integrated with a ridge waveguide structure is shown in FIG. 6 which is a cross sectional view. The device is fabricated on a SOI silicon wafer which includes a silicon substrate 601, oxide layers 602, 606, and a thin silicon layer 605. A ridge waveguide is built in the middle intrinsic silicon section 605. Two sides of the waveguide are doped to n-type 603 and p-type 607 to form a PIN diode. Metallization 604 connects the PIN diode to other parts of the circuitry.

Another example of the coupling mechanism between SPAD cell and waveguide is the use of thermal effect. Some optical waveguide materials such as silicon have a refractive index that changes with temperature. There are various well-known designs of waveguide thermo-optical modulators. To couple SPAD events and a waveguide optical signal, the SPAD event current is injected into a metal strip that is placed above a waveguide with designed resistance value. By ohmic heating, the metal strip's temperature rises, which causes a change in the refractive index of the waveguide below. A modulator uses the index change to modulate the optical signal in the waveguide structure. Note that the thermal coupling mechanism is not preferred for applications requiring high speed photodetection since thermal response is generally much slower than, for example, charge-induced loss discussed in previous sections.

To achieve a high data rate with a SPAD array integrated with a waveguide detector, the total response time must be sufficiently fast. The total response time should include SPAD event current response time, SPAD/Waveguide coupling response time, travel time of optical signal in the waveguide, and response time of the waveguide photodetector. SPAD event current response time depends on the structure, size and bias voltage. However, with recent development of techniques such as capacitive coupling, and active quenching, a single SPAD cell can have a fast response. SPAD/waveguide coupling response time is discussed in previous sections, and 200 MHz cut-off frequency is reported with a particular design. Propagation delay of the internal optical signal in the waveguide structure will contribute to a timing jitter. Due to the high index of silicon, a 10 cm length silicon waveguide could cause a timing jitter of 1 nsec. This is the reason that a serpentine routing of the waveguide among photodetector cells, FIG. 1, is not preferable. When the array size is on the order of square centimeters and the cell size is tens of microns, the total length of the waveguide connecting all cells by a single scan can be very long, on the order of meters, which causes tens of nanoseconds jitter. Another routing scheme is required to minimize this timing jitter. Finally, the response time of the photodetector for the internal optical signal in the waveguide is considered. With a heterogeneously integrated photodiode structure at the end of the waveguide structure, very high bandwidth is possible. The details are discussed in later sections.

When a PIN diode is used to couple a SPAD and a waveguide, the electrical circuit design of the coupling section can also improve the timing response. For example, the coupling PIN diode is placed in an anti-parallel configuration with a non-coupling diode (i.e., a diode with no optical waveguide integrated). In this configuration, the coupling diode flows only the fast-rising SPAD event current, and is coupled to the waveguide optical signal. A slow recharging current in the opposite direction flows in the non-coupling diode and does not cause a slow tail in the optical signal.

Figure 7:
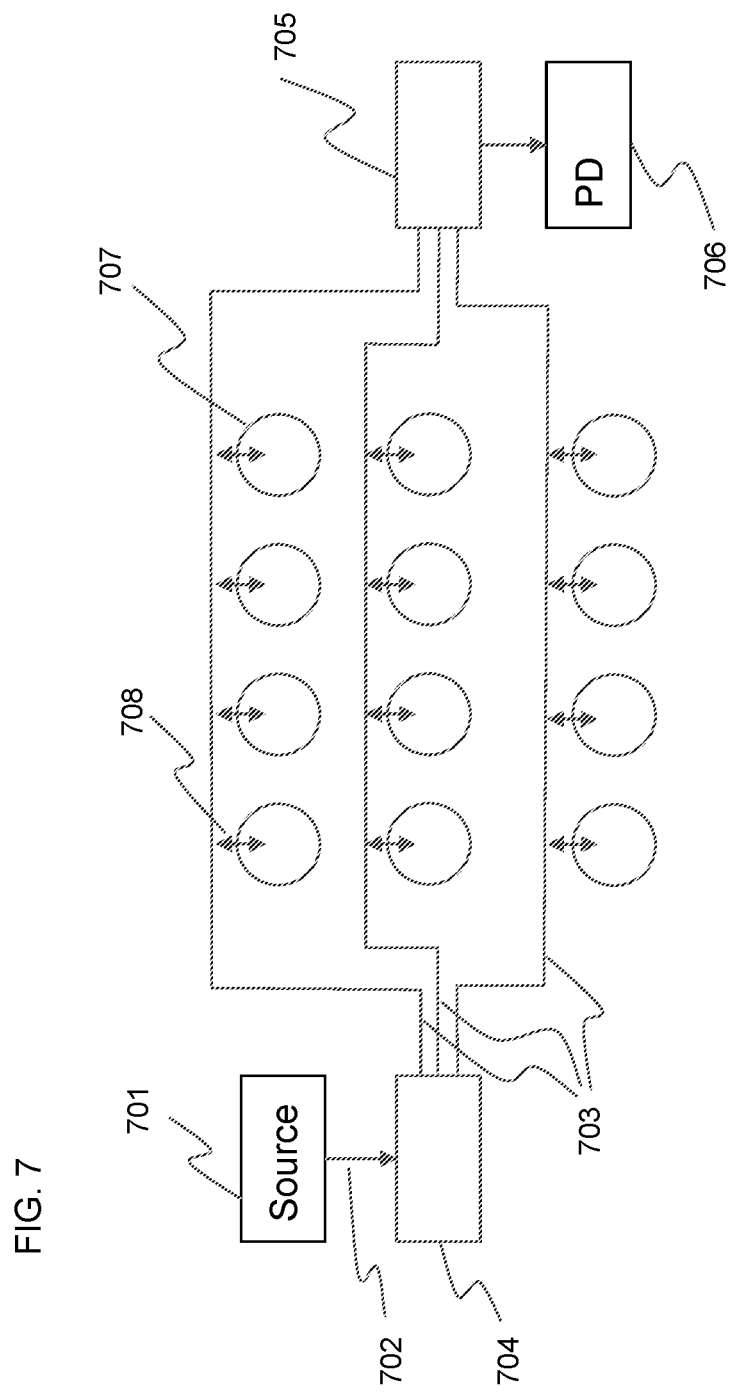
FIG. 7 depicts a schematic diagram of waveguide routing in the photodetector array.

To achieve the highest bandwidth of the sensor, we need to minimize the optical propagation loss and timing jitter of the internal optical signal in the waveguide. Several waveguide routing schemes are discussed in this section. As discussed in the previous section, routing a large number of SPAD cells with a single waveguide might result in a long waveguide and cause a large timing jitter. To avoid this performance degradation, multiple waveguide branches can be used to connect many SPAD cells. For example, FIG. 7 depicts another waveguide routing through a SPAD array using branches. A light source 701 is coupled to a single waveguide 702, then it splits into multiple branch waveguides 703 using a splitter structure 704, each waveguide branch connects only one part of the SPAD array, and branches are joined together after integrating the SPAD signal at a combiner structure 705, then the waveguide with combined internal optical signals leads to a photodetector 706 for final detection. As in FIG. 1, circles depict SPAD cells 707 and arrows depict coupling structures 708. This routing scheme makes each waveguide branch length short so that the timing jitter is minimized. Depending on the grouping of photodetector cells, and each waveguide branch to integrate, the waveguide routing design may require further consideration in order to minimize the timing jitter. If there is a difference in the length of waveguides between the splitter and the first photodetector cell in the sub-array that each waveguide branch integrates, additional timing jitter will be introduced. To avoid this timing jitter, waveguides should be routed to make the path length equal.

Figure 8:
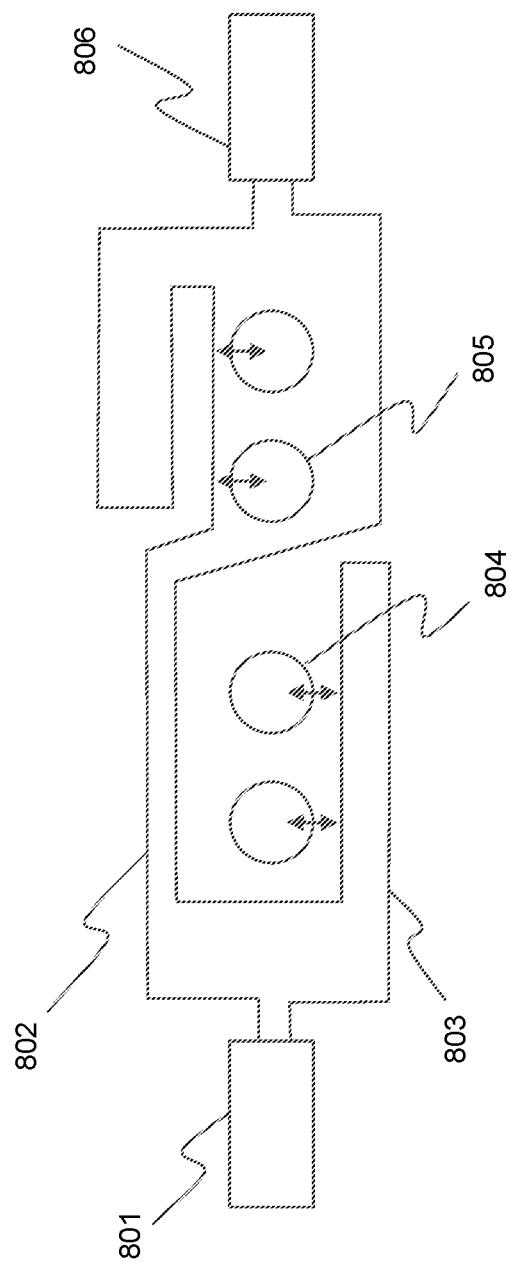
FIG. 8 depicts a waveguide routing design for minimum timing jitter.

FIG. 8 depicts one example of this routing design. At an input splitter 801, the optical power is split to two branches. One branch 803 integrates the two cells on the left and the other branch 802 integrates the two cells on the right. The waveguides are designed to equalize the path length between the splitter 801 and the first cell of each group 804, 805. And the length between the last cells and the combiner 806 is also equal. For the same reason, it is preferred for each cell group to have the same number of cells.

This routing needs proper splitter and combiner design. One example of the implementation is a star coupler. A star coupler is a device based on a waveguide structure that splits or combines the optical energy in the waveguides. A start coupler can be the splitter before waveguides entering the SPAD array, dividing the internal optical signal power into multiple branch waveguides. There are other known waveguide power splitter designs such as MMI (multimode interference) structure, and AWG (arrayed waveguide grating). Combining multiple waveguides' optical signals is more difficult. Usually, the reversed structure of the star coupler or MMI are used to combine the multiple input optical power, but often careful amplitude and phase control is required. In the case of internal optical signals in the waveguide coupled to SPAD cells, the signal coming to the combiner structure is not known prior, therefore it is difficult to adjust the phase accordingly.

Figure 9:
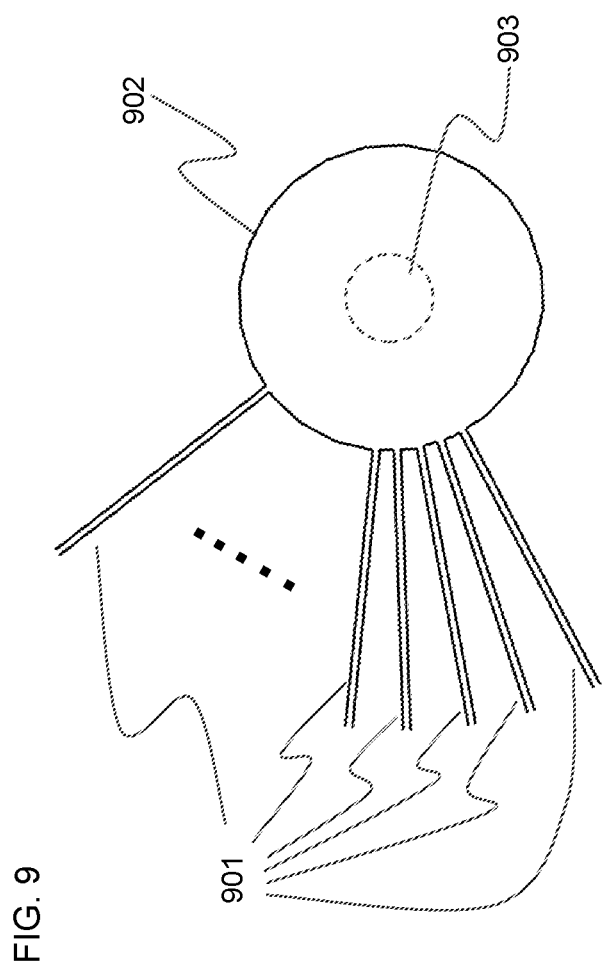
FIG. 9 depicts a top view of a waveguide optical power combiner with an integrated photodetector.

Detection of optical signal power from multiple waveguides can be achieved by arranging waveguides into a free-propagation region (FPR) strategically and placing the focal region in the designed position of FPR, geometrically. This scheme works only if the optical power is converted to electrical signal at the focal point, i.e., detected by the photodetector built into the focal region of the FPR. The optical power cannot be coupled back to a waveguide with this scheme. FIG. 9 depicts an example of such a waveguide photodetector design, geometrical focusing structure. Multiple waveguides 901 are connected to a circular FPR 902, and each waveguide axis is aligned to the center of the FPR. By placing an integrated photodiode at the center of the FPR, i.e., a focal region 903, the combined optical power from all incoming waveguides can be detected.

Figure 10:
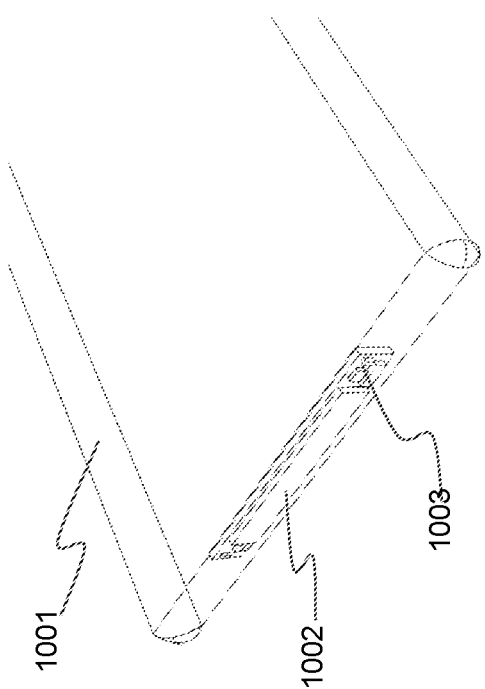
FIG. 10 depicts a conceptual image of a cell phone assembly integrated with a flat SPAD array sensor chip.

An application where we can use the photodetector array sensor of the present invention is free space optical communication (FSO). FSO is a wireless communication method using electromagnetic waves in an optical spectrum. Due to the high bandwidth nature of this wavelength range, ultra-high data rate is possible with FSO, much higher than other current wireless technologies such as Wi-Fi, Bluetooth, 5G Cellular, etc. To achieve a high data rate with low bit error rate (BER), the FSO receiver needs to receive sufficient optical signal power. Furthermore, FSO requires careful system design because optical signals cannot penetrate certain materials which may be transparent for other wavelengths such as RF (radio frequency). There is background noise from solar radiation in this spectrum, and an eye safety standard limitation of the optical power used in free space. Due to the ever-increasing demand for higher bandwidth for wireless communication, FSO has significant potential when integrated into consumer hand-held devices, such as cell phones, tablets, smart watches, and laptop computers. Successful FSO modules must have a small and flat form factor to match these devices' platform. However, in general, bulk optical components, such as lens, mirror, and prism, have a large size and make the system that includes them also large. Then the FSO modules for the consumer devices require flat format receivers and emitters. The photodetector array sensor of the present invention fits this requirement. Due to the nature of semiconductor devices, the shape of the photodetector array sensor is flat and thin. A size on the order of few to several centimeters square aperture is easily attained without increasing the thickness of the module. The shape of the sensor can also be square or rectangular with minimal limitations. No lens is necessary for the photodetector sensor for FSO application, which means that a very wide field-of-view can be achieved. Because of the large aperture of the device, even very low incoming signal density can achieve high data rate with low BER. As an example, FIG. 10 shows a conceptual image of a cell phone 1001 assembled with a flat optical receiver 1003 including the SPAD array optical sensor 1002 of the present invention.

The optical waveguide coupled data integration of the present invention also solves the issue of slow response of large scale SPAD arrays. This will make this photodetector sensor attractive for other applications requiring fast response and very sensitive photodetector too.

The present invention, a photodetector array with a waveguide structure, can be fabricated using several methods. As examples, we describe three methods to integrate a photodetector array and a waveguide structure on a single semiconductor chip surface.

Figure 11:
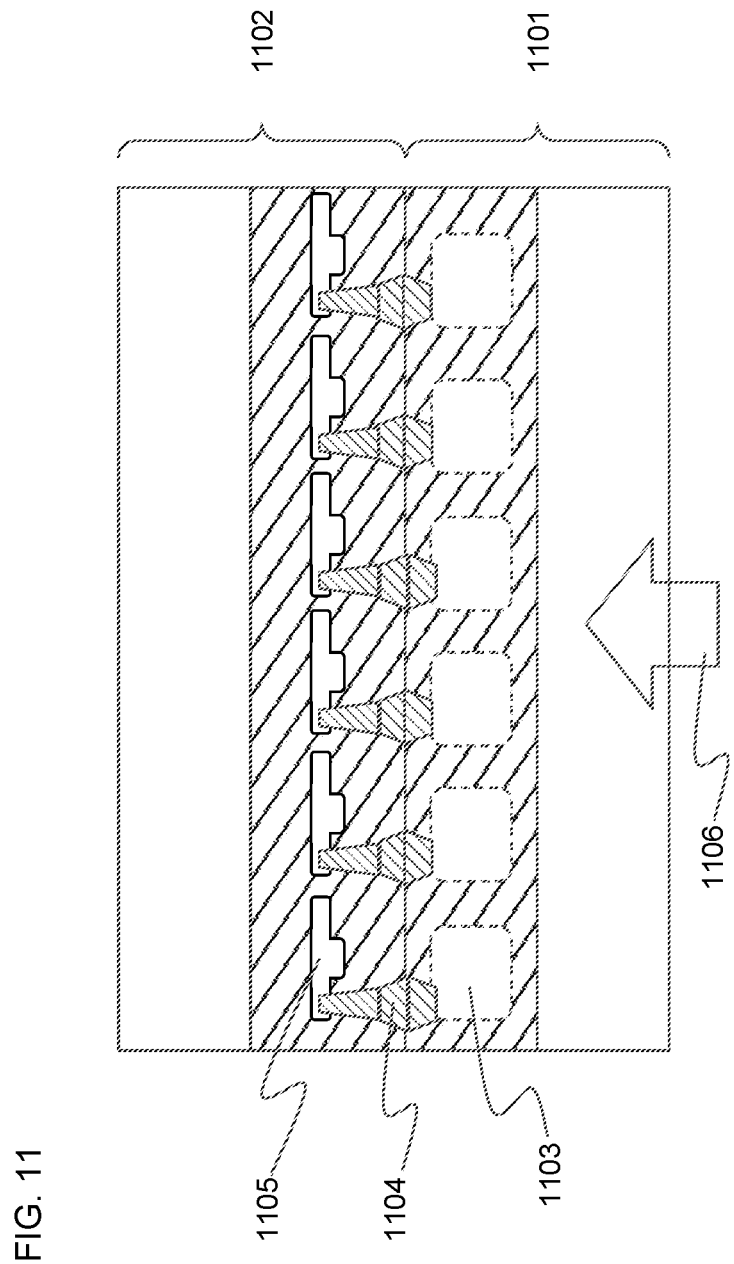
FIG. 11 depicts a cross sectional view of a photodetector array sensor integrated with waveguide structure fabricated by wafer-to-wafer bonding technology.

The first method utilizes wafer-to-wafer bonding. Wafer-to-wafer bonding is a common process in the semiconductor industry to attach two wafers' surfaces to form a single wafer. FIG. 11 depicts the bonded wafer structure's cross-sectional view. To achieve the present invention's configuration, at first, a photodetector array 1103 is fabricated on a semiconductor wafer surface 1101. The waveguide structure 1105 and electronic circuitry are fabricated on a separate semiconductor wafer surface 1102. Then the two wafers are bonded together to form a wafer with both photodetector array and waveguide structure. Usually, the electrical connection between two wafers bonded is made via special metal pads 1104 prepared on the surfaces prior to bonding. In FIG. 11, incoming optical signal should enter the sensor from the bottom 1106 to avoid waveguide and electrical circuitry of the top wafer, i.e. back-side illumination. This is a common method to fabricate photodetector array sensors. For example, Hagimoto (U.S. Pat. No. 10,485,293) published photodetector array sensors for a camera system fabricated with this method. Hagimoto first prepared a photodetector array on one semiconductor wafer. Then another wafer with electrical circuitry is prepared separately. Then wafer to wafer bonding is used to bond the wafers together. This method could be a preferable method for a high-performance sensor since the resulting photodetector cell can have nearly 100% fill factor if used with back-side illumination, and also the entire surface of the second wafer is available for waveguide structures and additional electric circuitry to integrate. The disadvantage of this method could be the potentially high cost of the wafer due to the two wafers' cost and additional processes and requirements for wafer-to-wafer bonding.

Figure 12:
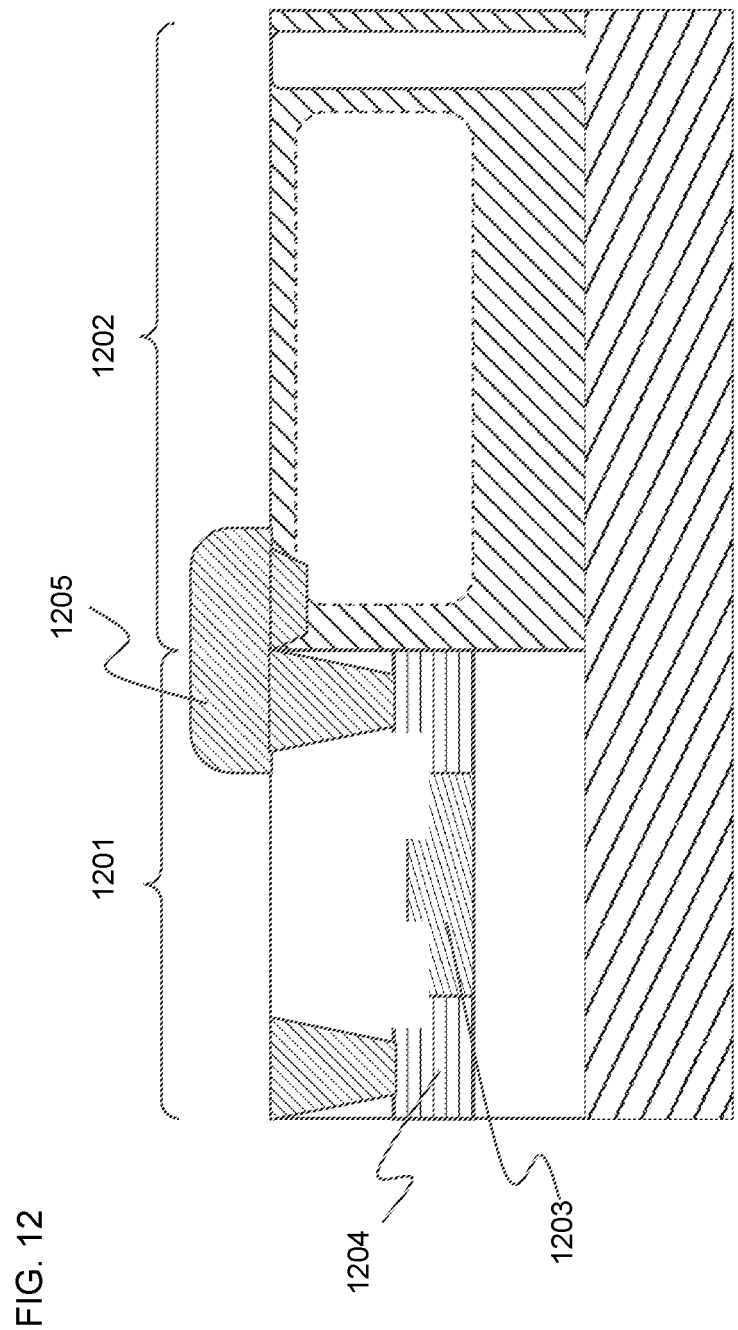
FIG. 12 depicts a cross sectional view of a photodetector cell and a waveguide structure fabricated side by side on a single semiconductor wafer surface.

The second method builds both photodetectors and waveguide structures on a single semiconductor wafer surface side by side. FIG. 12 depicts the resulting semiconductor wafer structure's cross-sectional view. For example, an SOI wafer is used to fabricate the silicon waveguide structure 1201. With processes such as etching, implantation, patterning and metallization, the waveguide structure 1203 and the electrical circuitry 1204 are integrated. Then the area 1202 designated for the photodetector cells is etched off to expose the base silicon surface. The photodetector array 1202 is fabricated on the same wafer using standard CMOS processes including the electrical connections 1205 between the photodetector cells and waveguide structure. Additional structures or circuitry can be built on top of the photodetector cells or waveguide structure as long as the thermal budget allows it. An example of a similar integration method is published by Analui (2006). Analui integrated a silicon waveguide structure and integrated electronic circuitry on the same surface, starting with an SOI wafer and following steps similar to the ones described here. This method is potentially low cost using fewer processes and only a single wafer. The disadvantage is the low fill factor of the photosensitive area of the photodetectors, but this could be recovered if an additional structure described in later paragraphs is used.

The third method is a layered structure to integrate a photodetector array and a waveguide structure. First, a photodetector array is fabricated on a semiconductor wafer surface. Then, layers are deposited on top of the photodetector cells for a waveguide structure. This method could have the lowest cost due to the simple process steps, and the photodetector cells could have nearly 100% fill factor similar to the first method since no waveguide structure is sharing the same layer in the wafer. However, the material quality of deposited layers for the waveguide structure needs to be managed carefully so that the waveguide has low propagation loss.

The waveguide structure needs its own light sources for the internal optical signals. Both internally integrated and externally coupled light sources can be used. There are publications for heterogeneously integrated lasers in waveguide structures. For example, Van Campenhout (2008) integrated a III-V laser on the same surface as a silicon waveguide. Though this approach is possible, it could have a high cost and require a unique process to implement. It is common to integrate light sources to waveguide structures in hybrid methods. Hybrid methods use separately fabricated laser die and attach the laser die to the wafer surface with the waveguide structure via a coupling structure in between. The coupling structure could be a grating, a tapered waveguide, etc. Hybrid methods can use a wide variety of laser die so that various wavelength, power and operation modes are available. However, it requires additional attachment processes and alignment processes, which make the assembly process slow. External light sources could be coupled to the waveguide structure on a semiconductor surface via an optical fiber. The end of the optical fiber from an external light source can be attached to the waveguides via edge coupling or surface coupling. Both coupling methods are widely used in the optical fiber device industry. External light sources can provide high performance light sources and coupling methods are well known, but the total system size is large and is not preferable for products requiring small unit size such as hand-held devices.

Photodetector integration for the internal optical signal of waveguides can be implemented with similar methods as the light source integration. Integrating high speed photodetectors to silicon waveguides is well known. For example, Lim published a 20 GHz bandwidth Ge photodetector integrated with silicon waveguides. A similar material and method can be used to fabricate a photodiode into the FPR of the optical power combiner at the end of the waveguide structure of the present invention. For the structure of the present invention, an external photodetector is not a preferable choice. As discussed in the previous sections, it is difficult, if not impossible, to combine in the optical domain the internal optical signal power from waveguide branches. This means that it is difficult to couple the internal optical signal into an optical fiber which can connect to an external photodetector system. Hybrid integration of a photodetector is possible. An example is to attach a photodetector die at the focal region of the FPR of an optical power combiner. Due to the nature of the focus method, it may be required to dice the wafer or to create a mesa at the FPR focal region to integrate the photodetector die. Because of the additional processes, the hybrid method could be expensive.

Figure 13:
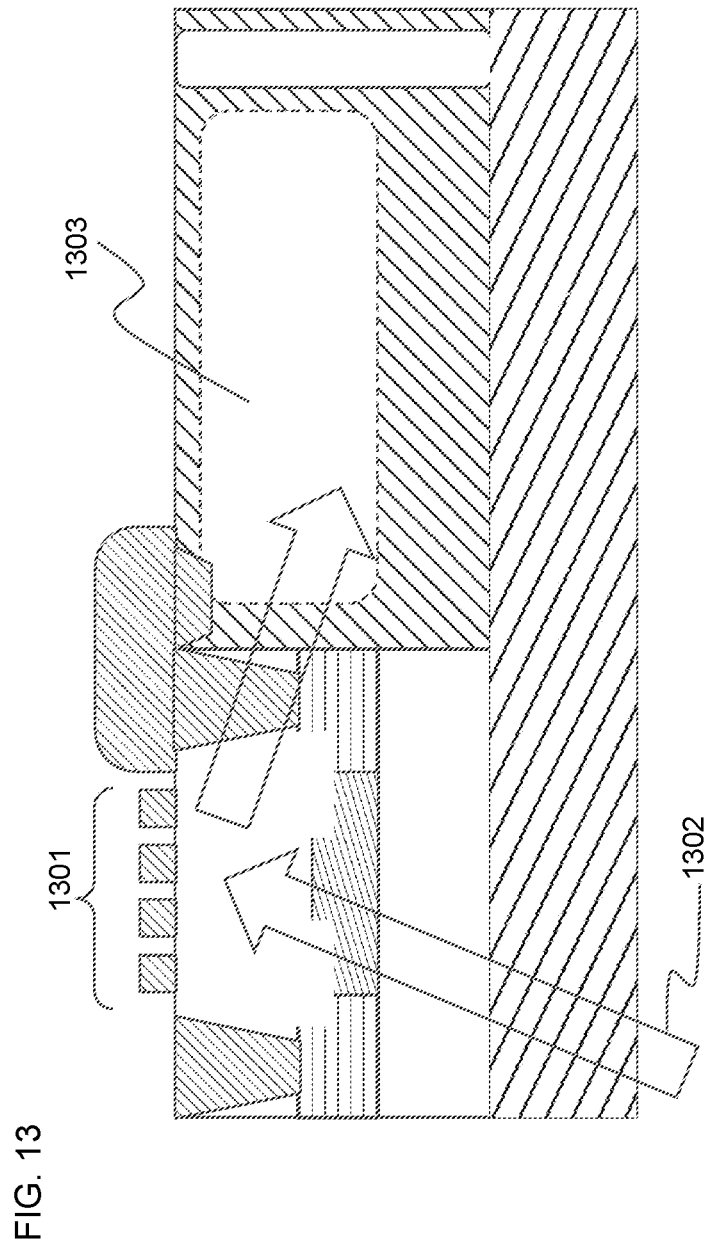
FIG. 13 depicts a cross sectional view of a photodetector array sensor with a reflective layer on top of the waveguide structure.

When the photodetector array and waveguide structure are fabricated onto the same semiconductor wafer surface side by side, the fill factor of the photodetector cell or its active area is reduced. To overcome this issue, one could add additional reflective or refractive structure on top of or around the waveguide structure area and change the direction of the incoming optical signal toward the photodetector region. One example of the implementation is a grating structure built in a semiconductor layer deposited on top of a waveguide structure, shown in FIG. 13. A grating is a periodic structure made with materials with refractive index contrast and can reflect or refract optical power. By designing the material choice, period and size of the periodic pattern, part of the incoming optical signal 1302 is reflected by the grating 1301 back toward the photodetection region 1303 of the detector cell. Note that the waveguide or electrical circuitry may block the incoming optical signal before reaching the grating structure, however the amount of area covered by such a structure is relatively small compared to the total area used to integrate the waveguide structure.

Figure 14:
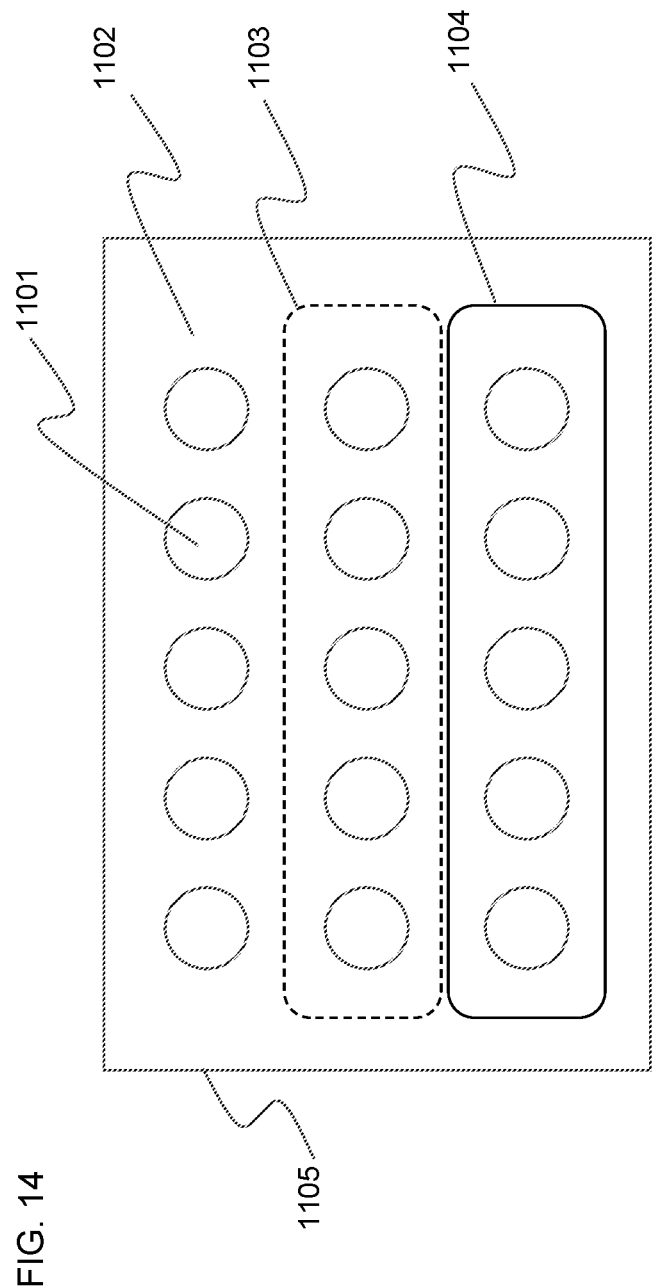
FIG. 14 depicts a top view of a photodetector array sensor with two different optical filters covering parts of the array.

Even with a large number of SPAD cells in an array, the SPAD array sensor still can saturate and lose the ability to detect incoming signals when incoming optical signal power is too high. One way to improve the situation is to use a filter to block a portion of the incoming signal before the photodetector to avoid the saturation. Since the number of SPAD cells in the array can be very large using the present invention, we can cover a part of the array with a filter to further extend the dynamic range of the sensor. For example, as shown in FIG. 14, if we cover one third of the array with 10% pass filter 1403, another third of the array with 1% pass filter 1404 and another third of the array 100% pass filter (no filter) 1402, the dynamic range of the array sensor 1405 is extended for stronger signal cases. FIG. 14 does not show the waveguide structure. The dynamic range of such a photodetector array sensor for an FSO system can cover the incoming power range from the high signal level of the eye safety limit to the low signal level for the highest sensitivity of the native SPAD capability.

When the sensor is covered by an optical filter partially, the accumulated, internal optical signal of the un-covered array could be quite different from the signal of the filtered array. Combining these signals together linearly may not provide an optimized signal. One example of improved signal handling of such a sensor is weighted summation of signals. Depending on the filter design, the signal from the filtered array is weighted before summing with the signal from the un-filtered array. The summation can be done optically or electrically. To do the summation electrically, each sub-array with filters must have separate photodetectors so that sub-arrays have separate electrical signal output. To do the summation optically, optical signal levels from each sub-array is adjusted by waveguide devices, such as variable optical attenuator, before combining at the photodetector.

This invention is not limited to SPAD photodetector arrays. The signal from an APD array which has the same structure as a SPAD array can be coupled and accumulated via a waveguide structure. Other types of photodetectors such as PIN diodes can also be used in the array. Although many other types of photodetectors have analog signals and accumulation by waveguide, optical signals may accumulate more noise than in the SPAD case, but the same structure works to integrate.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. A semiconductor photodetector array sensor comprising:
   a semiconductor photodetector array with a plurality of photodetector cells;
   an optical waveguide structure with an optical waveguide, the optical waveguide being coupled to the semiconductor photodetector array electrically;
   a light source coupled to the optical waveguide structure;
   a photodetector sensor coupled to the optical waveguide structure;
   a coupling structure at each of the plurality of photodetector cells, the coupling structure being configured to connect at least one of the plurality of photodetector cells and the optical waveguide structure to convert a photo event current at the at least one of the plurality of photodetector cells to an optical signal in the optical waveguide structure.

2. The sensor of claim 1, wherein each photodetector cell is a PIN diode structure, avalanche photodiode (APD) structure, or single-photon avalanche diode (SPAD) structure.

3. The sensor of claim 2, wherein the SPAD structure is fabricated to form front illuminated detection or to form back illuminated detection.

4. The semiconductor photodetector of claim 2, wherein the SPAD structure includes an additional capacitive coupling structure.

5. The sensor of claim 1, wherein the light source and photodetector sensor are integrated to the optical waveguide structure.

6. The sensor of claim 1, wherein the coupling structure comprises a PIN diode structure integrated with the optical waveguide structure and connected electrically to the photodetector sensor.

7. The sensor of claim 6, wherein the PIN diode structure includes a coupling PIN diode that is paired with another diode which is not coupled to the optical waveguide structure and connected in anti-parallel diodes configuration.

8. The sensor of claim 1, wherein the coupling structure includes a metal strip positioned across the optical waveguide structure, and the metal strip being electrically connected to the photodetector sensor.

9. The sensor of claim 1, wherein the optical waveguide structure includes at least one optical power splitter that has multiple output waveguides before said plurality of photodetector cells.

10. The sensor of claim 9, wherein the optical power splitter includes cascaded Y splitters, a star coupler, or a multimode interference splitter.

11. The sensor of claim 1, wherein the optical waveguide structure includes a first arrayed waveguide grating structure to split optical power to multiple branch waveguides before said plurality of photodetector cells and a second arrayed waveguide grating structure to combine the branch waveguides after the plurality of photodetector cells to combine the optical signal in the multiple branch waveguides.

12. The sensor of claim 1, wherein the optical waveguide structure includes a star focusing coupler to combine optical power from a plurality of waveguides after the plurality of photodetector cells into a designated region in a free propagation section of the coupler.

13. The sensor of claim 1, wherein the semiconductor photodetector array comprises optical filters before incoming optical signals impinging the photodetector surface, said optical filters covering the photodetector array at least partially.

14. The sensor of claim 13, wherein the optical filters include neutral density filter, polarization filter, or wavelength filter combined with thin film integrated filter.

15. The sensor of claim 13, wherein the semiconductor photodetector array includes a plurality of sub-arrays which have the optical filters with various transmittance and separate optical waveguide structures for each sub-array with separate photodetector sensors.

16. The sensor of claim 1, wherein a method to integrate the semiconductor photodetector array and the optical waveguide structure comprises:
a first semiconductor wafer surface with a photodetector array integrated with CMOS processes and metal pads prepared for further bonding processing;
a second semiconductor wafer with the optical waveguide structure and electrical circuitry integrated with material-specific processes and metal pads prepared to bond to the pads on the wafer with the photodetector array;
wafer-to-wafer bonding process used to attach the first and the second wafer together, mating the metal pads for electrical connection;
additional thinning process if the photodetector array is used in a back-side illumination configuration.

17. The sensor of claim 1, wherein a method to integrate the semiconductor photodetector array and optical waveguide structure comprises:
a optical waveguide structure fabricated onto a silicon-on-insulator wafer surface;
a photodetector array fabricated in the area without the optical waveguide structure;
a metal layer fabricated connecting between the photodetector array and the optical waveguide structure.

18. The sensor of claim 1, wherein a method to integrate the photodetector array and waveguide structure comprises:
a photodetector array fabricated on a semiconductor wafer surface;
material layers built on top of the photodetector array;
an optical waveguide structure fabricated in the layers above the photodetector array;
electrical connections fabricated between optical waveguide structure layers and the photodetector array.

19. The sensor of claim 1, wherein the coupling structure includes an additional optical reflective or refractive layer to direct incoming optical signal toward a photosensitive region of a photodetector.

20. The sensor of claim 1, wherein the optical waveguide structure includes a plurality of waveguide branches connected to the plurality of photodetector cells, where the plurality of waveguide branches are designed to have a same length before and after a photodetector sub-array coupling section.

* * * * *